United States Patent [19]

Wada et al.

[11] 4,410,621

[45] Oct. 18, 1983

[54] PHOTOSENSITIVE RESIN CONTAINING A COMBINATION OF DIPHENYL-IMIAZOLYL DIMER AND A HETEROCYCLIC MERCAPTAN

[75] Inventors: Minoru Wada, Nishinomiya; Minoru Fukuda, Nagaokakyo, both of Japan

[73] Assignee: Toyo Boseki Kabushiki Kaisha, Japan

[21] Appl. No.: 250,805

[22] Filed: Apr. 3, 1981

[51] Int. Cl.$^3$ .............................................. G03C 1/68
[52] U.S. Cl. .............................. 430/281; 204/159.15; 204/159.18; 204/159.23; 204/159.24; 430/286; 430/287; 430/288; 430/920; 430/922
[58] Field of Search ............... 430/281, 920, 922, 286, 430/287, 288; 204/159.18, 159.24, 159.23, 159.15

[56] References Cited

U.S. PATENT DOCUMENTS 3,479,185 11/1969 Chambers ........................... 450/270
4,252,887 2/1981 Dessauer ............................. 430/281

Primary Examiner—Jack P. Brammer
Attorney, Agent, or Firm—Jones, Tullar & Cooper

[57] ABSTRACT

A photosensitive resin composition which comprises (1) an ethylenically unsaturated compound which can be addition polymerized to form a high molecular compound, said addition polymerization being initiated by a free radical and chain-propagating, (2) a 2-polycyclic aryl-4,5-diphenylimidazolyl dimer wherein the polycyclic aryl group at the 2-position comprises at least two benzene rings condensed each other and (3) a heterocyclic mercaptan compound, said photosensitive resin composition being excellent in having a high photopolymerization initiation potency.

4 Claims, No Drawings

PHOTOSENSITIVE RESIN CONTAINING A COMBINATION OF DIPHENYL-IMIAZOLYL DIMER AND A HETEROCYCLIC MERCAPTAN

The present invention relates to a photosensitive resin composition. More particularly, it relates to a photosensitive resin composition comprising a photopolymerization initiation system having a high photopolymerization initiation potency.

As well known, a photosensitive resin composition usually comprises a photopolymerizable ethylenically unsaturated compound, a binding agent and a photopolymerization initiator. Such a composition is used for production of a relief printing plate, reproduction of an image, etc. For the purpose of this use, the composition is formed into a layer and exposed through a positive or negative film or a pattern mask. As a result, the photopolymerization initiator in the composition is activated by light, and the addition polymerization of the ethylenically unsaturated compound is thus initiated. After sufficient exposure, the resultant latent image is changed to a visible image by an appropriate procedure such as washing out with a solvent, selective elimination, thermal transfer or application of a pigment.

As the photopolymerization initiator for a photosensitive resin composition comprising a photopolymerizable ethylenically unsaturated compound, there is usually employed benzoin alkyl ethers, benzophenones, etc. However, the polymerization initiation potency of such photopolymerization initiators is greatly lowered due to a trace of oxygen dissolved in the composition. Because of this reason, the development of a highly sensitive photopolymerization initiator having a radical producing rate much higher than the oxygen induced radical quenching rate has been demanded. This demand is particularly strong in the case where the layer of photosensitive resin composition is relatively small so that the influence of air contacting on the surface is apt to be great, or in the case where the layer of photosensitive resin composition comprises a relatively large amount of an ultraviolet ray absorbing material such as a pigment so that a sufficient amount of ultraviolet rays cannot reach to the lower part of the layer.

The combination of 2,4,5-triphenylimidazolyl dimer with leuco dye as disclosed in Japanese Patent Publication. No. 37377/70, the combination of 2,4,5-triphenylimidazoylyl dimer with Michler's ketone as disclosed in Japanese Patent Publication No. 38403/73, etc. meet the above demand to a certain extent. However, even these photopolymerization initiation systems are not satisfactorily effective in curing a layer of a photosensitive resin composition which is relatively thin and yet contains a high concentration of an ultraviolet ray absorbing material such as a pigment.

As the result of an extensive study seeking a photopolymerization initiation system having a high photopolymerization initiation potency which meets the above requirements, it has now been found that the combination of a 2-polycyclic aryl-4,5-diphenylimidazolyl dimer and a heterocyclic mercaptan compound shows an extremely high photopolymerization initiation potency.

Based on the above finding, the present invention provides a photosensitive resin composition which comprises (1) an ethylenically unsaturated compound which can be addition polymerized to form a high molecular compound, said addition polymerization being initiated by a free radical and chain-propagating, (2) a 2-polycyclic aryl-4,5-diphenylimidazolyl dimer wherein the polycyclic aryl group comprises at least two benzene rings condensed each other and (3) a heterocyclic mercaptan compound, optionally with a photosensitizer.

The 2-polycyclic aryl-4,5-diphenylimidazolyl dimer is representable by the formula:

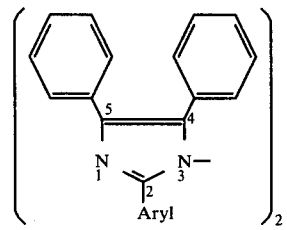

wherein Aryl represents a condensed ring comprising at least two benzene rings, Aryl and two phenyl groups indicated in the said formula bearing optionally any substituent(s).

Specific examples of the 2-polycyclic aryl-4,5-diphenylimidazolyl dimer are 2-(1-naphthyl)-4,5-diphenylimidazolyl dimer, 2-(9-anthryl)-4,5-diphenylimidazolyl dimer, 2-pyrenyl-4,5-diphenylimidazolyl dimer, 2-(2-methoxy-1-naphthyl)-4,5-diphenylimidazolyl dimer, 2-(2-chloro-1-naphthyl)-4,5-diphenylimidazolyl dimer, 2-(2-bromo-1-naphthyl)-4,5-diphenylimidazolyl dimer, 2-(2,4-dimethoxy-1-naphthyl)-4,5-diphenylimidazolyl dimer, 2-(2,4-dichloro-1-naphthyl)-4,5-diphenylimidazolyl dimer, 2-(1-naphthyl)-4,5-di(p-chlorophenyl)imidazolyl dimer, 2-(1-naphthyl)-4,5-di(p-methoxyphenyl)imidazolyl dimer, etc.

The polymerization initiation potency is widely varied with the kind of the substituent at the 2-position, and those having a polycyclic aryl group comprising at least two benzene rings condensed each other such as naphthyl or anthryl show a much higher potency than those having a monocyclic aryl group, i.e. phenyl, in the combined use with a free radical producing agent such as a heterocyclic mercaptan compound.

The 2-polycyclic aryl-4,5-diphenylimidazolyl dimer can be prepared by the method as described in Hayashi et al.: Bull. Chem. Soc. Japan, 33, 565 (1960). Namely, a polycyclic aryl aldehyde and benzil or its derivative are refluxed in the presence of an excess amount of ammonium acetate to produce a 2-polycyclic aryl-4,5-diphenylimidazole, and this compound is dissolved in an ethanolic solution of potassium hydroxide, followed by introducing oxygen therein while cooling with ice and while adding an aqueous solution of potassium ferricyanide dropwise thereto. As the starting polycyclic aryl aldehyde, there may be used 1-naphthylaldehyde, 2-naphthylaldehyde, 9-anthrylaldehyde, pyrenylaldehyde, etc. These may optionally bear a substituent(s) such as lower alkyl, lower alkoxy and halogen on the phenyl group and/or the polycyclic aryl group.

As a radical producing agent, there are known active hydrogen-containing compounds such as amines, particularly tertiary amines, leuco dyes, halogenated hydrocarbons, N-phenylglycine and dimedone, thioureas, etc. Among various radical producing agents, a heterocyclic mercaptan compound has been found to be especially excellent in the combined use with the 2-polycyclic aryl-4,5-diphenylimidazole dimer. As the result of the test by exposure to ultraviolet rays through $21\sqrt{2}$ step tablet, it has been found that the combined use with a heterocyclic mercaptan compound such as 2-mercaptobenzimidazole, 2-mercaptobenzoxazole or 2-mercaptobenzothiazole can afford a photosensitive resin composition having a high photopolymerization initiation potency and a good storage stability. As the heterocyclic organic mercaptan compound, there may be exemplified 2-mercaptopyridine, 4-mercaptopyridine, 2-mercapto-3H-quinazolinone, 2-mercaptothiazoline, 2-mercapto-1-methylimidazole, etc. in addition to the above exemplified compounds. The molar ratio of the 2-polycyclic aryl-4,5-diphenylimidazolyl dimer and the heterocyclic mercaptan compound is preferred to be from 5:1 to 1:5, preferably from 2:1 to 1:4.

The photosensitive resin composition of the invention comprises in addition to the said photopolymerization initiation system, an ethylenically unsaturated compound and optionally a binding agent.

As the ethylenically unsaturated compound, of which the polymerization is initiated by a free radical to afford a high molecular compound by addition polymerization, there are exemplified alkyl acrylates (e.g. cyclohexyl acrylate, decyl acrylate, lauryl acrylate), hydroxyalkyl acrylates (e.g. 2-hydroxyethyl acrylate), aminoalkyl acrylates (e.g. N,N-dimethylaminoethyl acrylate), alkoxyalkyl acrylates (e.g. 2-methoxyethyl acrylate), epoxyalkyl acrylates (e.g. glycidyl acrylate), haloalkyl acrylates (e.g. 2-chloroethyl acrylate), polyfunctional acrylates (e.g. trimethylolpropane triacrylate, trimethylolpropane trimethacrylate, triethyleneglycol dimethacrylate), etc. There may be also used thermoplastic polymers having an ethylenically unsaturated group at the side chain such as the one of the formula:

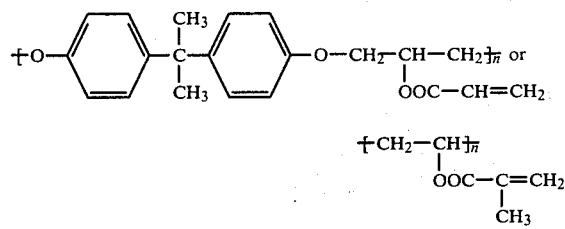

The binding agent, as an optional component, serves to regulate the physical properties of the photosensitive resin composition, and various soluble polymers may be employed as the binding agent. Specific examples of the binding agent are those which become insoluble in a solvent as the whole together with the ethylenically unsaturated compound (irrespective of being bound or not with the ethylenically unsaturated compound) on the irradiation such as polyamides, polyacrylic esters, acrylic acid/alkyl acrylate copolymers, methacrylic acid/alkyl methacrylate copolymers, polyvinylphenols, polyvinyl esters, polyacrylamides, polyvinyl alcohols, polyethylene oxides, gelatin, cellulose esters, cellulose ethers, etc.

Suitable binding agents are polymers which have a carboxyl group, a phenolic group or a sulfonic acid group, or a nitrogen atom quaternizable with an acid. The polymers having a carboxyl group, a phenolic group or a sulfonic acid group are developable with an aqueous alkaline solution and can be washed out or fixed with water. The polymers having a quaternizable nitrogen atom are developable with an aqueous acidic solution and can be washed out or fixed with water.

The photosensitive resin composition of the present invention can be used for preparation of printing plates for relief printing, lithographic printing, etc., as materials for electronics such as photoresist, solder mask, etc. Particularly when used for preparation of a non-silver litho film, it can contain advantageously a high concentration of an ultraviolet rays-absorbing agent (e.g. carbon black) in the photopolymerizable layer.

A typical example of the weight proportion of the components in the photosensitive resin composition of the invention directed to the said use is as follows: the combined amount of the 2-polycyclic aryl-4,5-diphenylimidazolyl dimer and the heterocyclic mercaptan compound, 0.3 to 15% by weight (on the basis of the total weight of the composition); the ethylenically unsaturated compound, 30 to 80% by weight; the binding agent, 0 to 60% by weight, preferably 10 to 60% by weight.

In the photosensitive resin composition of the invention, there may be additionally incorporated other various additives depending on necessity. Examples of such additives are carbon black, titanium oxide, powders of metals and metal oxides, light absorbers such as pigments and dyes, sensitizers, chain transfer promoters, thermal polymerization inhibitors, etc. Specific examples of said sensitizers are coumarine compounds (e.g. 7-diethylamino-4-methylcoumarine, 3-ethoxycarbonyl-7,8-benzocoumarine), p-aminophenylketone compounds (e.g. Michler's ketone), triarylpyrazoline derivatives (e.g. triphenylpyrazoline), bisoxazole compounds (e.g. $\alpha,\beta$-bis(5-methylbenzoxazolyl-(2) ethylene), bistriazinyldiaminostilbene and its derivatives, bisacyldiaminostilbene and its derivatives, bisureidostilbene and its derivatives, etc.

These additives are usually incorporated into the photosensitive resin composition of the invention in such a small amount of up to 3%. When pigments are incorporated, their amount is usually from 5 to 75% based on the total weight of the composition to make ultraviolet rays curing paints, inks, compositions for preparation of non-silver litho films, etc. For manufacture of image-forming plates, the photosensitive resin composition may be applied onto any substrate to make a coating layer or molded to shape a sheet.

When used as a photopolymerizable image-forming plate, such plate is subjected to exposure through a suitable original pattern film or a pattern mask, followed by development to make a visible image. As already stated, the photopolymerization initiation system of the invention has an especially high activity, and satisfactory polymerization can be attained by exposure within several seconds to several minutes even when a conventional ultraviolet rays source is used for exposure.

Practical and presently preferred embodiments of the invention are illustratively shown in the following examples wherein % and part(s) are by weight.

REFERENCE EXAMPLE 1

Preparation of 2-(1-naphthyl)-4,5-diphenylimidazolyl dimer:

A solution of benzyl (16.8 parts), α-naphthaldehyde (12.5 parts) and ammonium acetate (48 parts) in glacial acetic acid (400 parts) was refluxed for 1.5 hours. The reaction mixture was added to cold water, and the precipitate was collected by filtration, washed with water and dried. The dried product (26 parts) was recrystallized from ethanol to give 2-(1-naphthyl)-4,5-diphenylimidazole. M.P., 290° C.

The above obtained 2-(1-naphthyl)-4,5-diphenylimidazole (4 parts) was dissolved in a solution of potassium hydroxide (48 parts) in ethanol (400 parts by volume). While keeping this solution at a temperature of 0° to 5° C., oxygen gas was introduced therein at a rate of 400 parts by volume/min, during which a 1% aqueous potassium ferricyanide solution (1800 parts by volume) was dropwise added thereto in 3 hours under stirring. The reaction mixture was filtered, and the collected substance was washed with water, dried and recrystallized from benzene to give 2-(1-naphthyl)-4,5-diphenylimidazolyl dimer. From the consumed amount of hydroquinone under irradiation of ultraviolet rays, the purity was determined to be 79%.

REFERENCE EXAMPLE 2

Comparison of 2-polycyclic aryl-4,5-diphenylimidazolyl dimer with 2,4,5-triphenylimidazolyl dimer in photopolymerization initiation potency:

Using the following two compositions comprising an ethylenically unsaturated compound and a photopolymerization initiator, their behavior which occurred on the mixing of the said monomer and the said photopolymerization initiator was observed:

| Composition A | |
|---|---|
| Trimethylolpropane triacrylate | 27.0 g |
| 2-(1-Naphthyl)-4,5-diphenyl-imidazolyl dimer | 8.05 g |
| 2-Mercaptobenzothiazole | 1.95 g |
| Composition B | |
| Trimethylolpropane triacrylate | 27.0 g |
| 2-(o-Chlorophenyl)-4,5-diphenyl-imidazolyl dimer | 7.98 g |
| 2-Mercaptobenzothiazole | 2.02 g |

In the composition A, the mixing produced immediate and rapid generation of heat with white smoke, and the polymerization proceeded to solidify. In the composition B, the mixing did not produce any change, and it remained in a liquid state.

EXAMPLE 1

For judgement of the potency of the photopolymerization initiation system, 2-(1-naphthyl)-4,5-diphenylimidazolyl dimer and a heterocyclic mercaptan compound, their combined amount being 10 g, were added to a mixture of the following materials:

| Methyl methacrylate/methacrylic acid (70/30 by mol) copolymer | 54.2 g |
|---|---|
| Ethylene glycol diacetate | 3.8 g |
| Trimethylolpropane triacrylate | 32.0 g |
| Methanol | 217.0 g |
| Methylene chloride | 136.0 g |

After sufficient mixing, the resultant mixture was applied onto a transparent film of polyethylene terephthalate of 125μ in thickness to make a coating layer of 5μ in thickness after drying. Then, a 10% aqueous solution of polyvinyl alcohol (completely saponified; degree of polymerization, 500) was applied thereto to make an overcoat layer of 2μ in thickness, whereby a clear test piece was obtained.

Onto the clear test piece as above obtained, a 21$\sqrt{2}$ step tablet (a gray film scale manufactured by Dainippon Screen Mfg. Co., Ltd.) as a negative film was placed and an ultra high pressure mercury lamp (a polymer printer 3000 manufactured by Oak Seisakusho, 140 W/m$^2$) was irradiated thereto for 1 minute. The test piece was washed with water, immersed in a 4% aqueous solution of sodium carbonate at 25° C. for 8 seconds, again washed with water and dried. The step number at which the exposure and development of the 21$\sqrt{2}$ gray scale were completely achieved was examined by visualizing with methylene blue dyeing to ascertain the sensitivity of the photopolymerization initiator system. The results are shown in Table 1 wherein the numeral indicates the sensitivity of the photopolymerization initiation system by the step number of the gray scale and the greater number represents a high sensitivity.

TABLE 1

| Sample No. | Photopolymerization initiator system | Molar ratio | Sensitivity (step) |
|---|---|---|---|
| Present invention | | | |
| 1 | 2-(1-Naphthyl)-4,5-diphenyl-imidazolyl dimer/2-Mercaptobenzoxazole | 2/1 | 18–19 |
| 2 | 2-(1-Naphthyl)-4,5-diphenyl-imidazolyl dimer/2-Mercaptobenzoxazole | 1/1 | 15–16 |
| 3 | 2-(1-Naphthyl)-4,5-diphenyl-imidazolyl dimer/2-Mercaptobenzothiazole | 2/1 | 14–15 |
| 4 | 2-(1-Naphthyl)-4,5-diphenyl-imidazolyl dimer/2-Mercaptobenzothiazole | 1/1 | 18 |
| 5 | 2-(1-Naphthyl)-4,5-diphenyl-imidazolyl dimer/2-Mercaptobenzimidazole | 1/1 | 17 |
| Comparative | | | |
| 6 | 2-(o-Chlorophenyl)-4,5-diphenylimidazolyl dimer/2-Mercaptobenzoxazole | 2/1 | 12–13 |
| 7 | 2-(o-Chlorophenyl)-4,5-diphenylimidazolyl dimer/2-Mercaptobenzoxazole | 1/1 | 12 |
| 8 | 2-(o-Chlorophenyl)-4,5-diphenylimidazolyl dimer/2-Mercaptobenzothiazole | 2/1 | 10 |
| 9 | 2-(o-Chlorophenyl)-4,5-diphenylimidazolyl dimer/2-Mercaptobenzothiazole | 1/1 | 11–12 |
| 10 | 2-(1-Naphthyl)-4,5-diphenyl-imidazolyl dimer/Leuco Malachite Green | 2/1 | 7 |
| 11 | 2-(1-Naphthyl)-4,5-diphenyl-imidazolyl dimer/Michler's ketone | 2/1 | 13 |
| 12 | 2-(1-Naphthyl)-4,5-diphenyl-imidazolyl dimer/N—Phenyl-glycine | 2/1 | 11 |
| 13 | 2-(1-Naphthyl)-4,5-diphenyl-imidazolyl dimer/2-Allylthiourea | 2/1 | 6 |

In the above Table, Sample Nos. 1 to 5 are the embodiments of this invention. Sample Nos. 6 to 9 wherein known 2,4,5-triphenylimidazolyl dimer was used are for the comparison. From the above results, it is understood that the photopolymerization initiator system of this invention attains the increase of the sensitivity by a gray scale of 3 to 5 in average. Sample Nos. 10 to 13 are also for the comparison and show the combination of the 2-polycyclic aryl-4,5-diphenylimidazolyl dimer with a conventional radical producing agent. In all of these cases, the sensitivity is lower than that attained by the combination of such dimer with the heterocyclic mercaptan compound according to this invention. Under the same experimental conditions as above, the use of benzoin ethyl ether which is a conventional photopolymerization initiator does not reach any step within the 5 gray scale in case of exposure for 1 minute and reaches a step of 5 in case of exposure for 5 minutes. When the combination of benzophenone with Michler's ketone (7/1 by mol) which is a conventional photopolymerization initiation system for pigment-containing ultraviolet ray-curing paints and inks is used, a scale of 7 is reached by exposure for 1 minute. Therefore, it is understood that the photopolymerization initiation system of this invention shows the highest activity among photopolymerization initiation systems heretofore been made available.

EXAMPLE 2

In the same manner as in Example 1 but using a photopolymerization initiation system as shown in Table 2, there was prepared a clear test piece, which was subjected to judgement of the sensitivity. The results are shown in Table 2.

TABLE 2

| Sample No. | Photopolymerization initiator system | Molar ratio | Sensitivity (step) |
|---|---|---|---|
| 14 | 2-(2-Methoxy-1-naphthyl)-4,5-diphenylimidazolyl dimer/2-Mercaptobenzimidazole | 1/1 | 15–16 |
| 15 | 2-(2-Chloro-1-naphthyl)-4,5-diphenylimidazolyl dimer/2-Mercaptobenzimidazole | 1/1 | 14–15 |
| 16 | 2-(2-Bromo-1-naphthyl)-4,5-diphenylimidazolyl dimer/2-Mercaptobenzimidazole | 1/1 | 14–15 |
| 17 | 2-(2,4-Dimethoxy-1-naphthyl)-diphenylimidazolyl dimer/2-Mercaptobenzimidazole | 1/1 | 15–16 |
| 18 | 2-(2,4-Dichloro-1-naphthyl)-4,5-diphenylimidazolyl dimer/2-Mercaptobenzimidazole | 1/1 | 14 |
| 19 | 2-(1-Naphthyl)-4,5-di(p-chlorophenyl)imidazolyl dimer/2-Mercaptobenzimidazole | 1/1 | 16 |
| 20 | 2-(1-Naphthyl)-4,5-di(p-methoxyphenyl)imidazolyl dimer/2-Mercaptobenzimidazole | 1/1 | 15 |
| 21 | 2-(2-Naphthyl)-4,5-diphenylimidazolyl dimer/2-Mercaptobenzimidazole | 1/1 | 14 |
| 22 | 2-(9-Phenanthryl)-4,5-diphenylimidazolyl dimer/2-Mercaptobenzimidazole | 1/1 | 14 |
| 23 | 2-(9-Anthryl)-4,5-diphenylimidazolyl dimer/2-Mercaptobenzimidazole | 1/1 | 14 |

As understood from the above Table, Sample Nos. 14 to 18 (the naphthyl group being substituted), Sample Nos. 19 and 20 (the phenyl group being substituted) and Sample Nos. 22 and 23 (the polycyclic aryl group being a condensed cyclic one other than naphthyl) have all a high sensitivity.

EXAMPLE 3

Onto a biaxially stretched film of polyethylene terephthalate of 100μ in thickness having a lined layer, the following composition was applied by the aid of a reverse coater to make a photosensitive layer of 4μ in thickness. The optical density of the photosensitive layer was 2.6 in average in a scope of 350 to 400 mμ.

| | |
|---|---|
| Methyl methacrylate/methacrylic acid (7/3 by mol) copolymer | 43.4 parts |
| Carbon black (Ultraviolet rays absorber) | 10.6 parts |
| Trimethylolpropane triacrylate | 36.0 parts |
| Photopolymerization initiator | 10.0 parts |
| Hydroquinone monomethyl ether | 0.03 part |
| Methanol | 250.0 parts |
| Methylene chloride | 67.0 parts |

Onto the photosensitive layer, a 10% aqueous solution of polyvinyl alcohol (saponification degree, 98–99 mol %; degree of polymerization, 500) was applied to make a protective layer of 2μ in thickness.

Onto the thus obtained film, a 21$\sqrt{2}$ step tablet was placed, and a ultra high pressure mercury lamp (a polymer printer 3000 manufactured by Oak Seisakusho; 140 W/m$^2$) was irradiated thereto. The protective layer was washed out, and the resulting film was immersed in a 2% aqueous solution of sodium carbonate at 25° C. for 6 seconds. Development was carried out by rubbing with a sponge in water. The optimum exposure time (the exposure time required for curing 6 step in the step tablet) was determined and shown in Table 3.

TABLE 3

| Sample No. | Photopolymerization initiator system | Molar ratio | Optimum exposure time (seconds) |
|---|---|---|---|
| 1 | 2-(1-Naphthyl)-4,5-diphenylimidazolyl dimer/2-Mercaptobenzimidazole | 1/1 | 8 |
| 2 | 2-(1-Naphthyl)-4,5-diphenylimidazolyl dimer/2-Mercaptobenzoxazole | 1/1 | 7 |
| 3 | 2-(o-Chlorophenyl)-4,5-diphenylimidazolyl dimer/2-Mercaptobenzimidazole | 1/1 | 64 |
| 4 | 2-(o-Chlorophenyl)-4,5-diphenylimidazolyl dimer/2-Mercaptobenzoxazole | 1/1 | 56 |
| 5 | 2-(1-Naphthyl)-4,5-diphenylimidazolyl dimer/Michler's ketone | 1/1 | 28 |
| 6 | Benzophenone/Michler's ketone | 5/1 | 60 |
| 7 | Benzoin ethyl ether | — | 240 |
| 8 | Benzyl dimethyl ketal | — | 90 |

As understood from the above results, the combination of 2-(1-naphthyl)-4,5-diphenylimidazolyl dimer as the 2-polycyclic aryl-4,5-diphenylimidazolyl dimer and 2-mercaptobenzimidazole as the heterocyclic mercaptan compound requires only an extremely short time for exposure due to its high initiation ability. Such combination is particularly useful for a non-silver salt film having a photosensitive layer containing a high concentration of a ultraviolet rays absorbing agent which requires a photopolymerization initiation system of high sensitivity. A litho film using the photopolymerization initiation system of the invention has no pinhole in a flat portion and shows a good reproducibility of dots of 150 l/inch and 5 to 95% with a reduction of up to 15%.

What is claimed is:
1. A photosensitive resin composition which comprises (1) an ethylenically unsaturated compound which can be addition polymerized to form a high molecular compound, said addition polymerization being initiated by a free radical and chain-propagating, (2) a 2-polycyclic aryl-4,5-diphenylimidazolyl dimer wherein the polycyclic aryl group at the 2-position comprises at least two benzene rings condensed each other and (3) a heterocyclic mercaptan compound, the molar ratio of the 2-polycyclic aryl-4,5-diphenylimidazolyl dimer and the heterocyclic mercaptan compound being from 5:1 to 1:5.

2. The composition according to claim 1, wherein the polycyclic aryl group in the compound (2) is naphthyl.

3. The composition according to claim 1, which further comprises (4) a photosensitizer.

4. The composition according to claim 1, which further comprises a binding agent.

* * * * *